United States Patent
Kang et al.

(10) Patent No.: US 7,899,148 B2
(45) Date of Patent: Mar. 1, 2011

(54) SHIFT REGISTER, SCAN DRIVING CIRCUIT AND DISPLAY DEVICE HAVING THE SAME

(75) Inventors: Seung-Jae Kang, Cheonan-si (KR); Seoung-Bum Pyoun, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 826 days.

(21) Appl. No.: 11/623,499

(22) Filed: Jan. 16, 2007

(65) Prior Publication Data

US 2007/0192659 A1 Aug. 16, 2007

(30) Foreign Application Priority Data

Feb. 15, 2006 (KR) ...................... 10-2006-0014545

(51) Int. Cl.
*G11C 19/00* (2006.01)

(52) U.S. Cl. ............................ 377/64; 377/68; 377/70; 377/75

(58) Field of Classification Search ........................ None
See application file for complete search history.

(56) References Cited

U.S. PATENT DOCUMENTS

| | | | | |
|---|---|---|---|---|
| 3,482,114 A | * | 12/1969 | Marshall | ...................... 377/112 |
| 3,638,036 A | * | 1/1972 | Zimbelmann | ................ 326/96 |
| 3,781,570 A | * | 12/1973 | Ross | ........................... 327/200 |
| 3,794,856 A | * | 2/1974 | Baker | ........................... 377/79 |
| 3,812,520 A | * | 5/1974 | Baker | ........................... 326/15 |
| 3,838,293 A | * | 9/1974 | Shah | ............................ 377/79 |
| 3,862,435 A | * | 1/1975 | Salters et al. | .................. 377/68 |
| 4,017,741 A | * | 4/1977 | Briggs | .......................... 377/79 |
| 4,484,087 A | * | 11/1984 | Mazin et al. | ................... 377/79 |
| 5,701,136 A | * | 12/1997 | Huq et al. | .................... 345/100 |
| 5,859,630 A | * | 1/1999 | Huq | ........................... 345/100 |
| 6,845,140 B2 | * | 1/2005 | Moon et al. | .................... 377/78 |
| 7,529,334 B2 | * | 5/2009 | Jang | ............................ 377/64 |
| 2003/0231735 A1 | * | 12/2003 | Moon et al. | ................... 377/64 |
| 2006/0267912 A1 | * | 11/2006 | Lee et al. | ..................... 345/100 |
| 2008/0012816 A1 | * | 1/2008 | Moon | ......................... 345/100 |
| 2008/0055293 A1 | * | 3/2008 | Kuo et al. | .................... 345/204 |
| 2008/0226013 A1 | * | 9/2008 | Deane | ........................... 377/70 |

\* cited by examiner

*Primary Examiner*—Tuan Lam
(74) *Attorney, Agent, or Firm*—Cantor Colburn LLP

(57) ABSTRACT

A shift register includes a plurality of stages, each of the stages generate an output signal, in sequence. Each of the shift register includes a present stage and a first capacitor. The present stage outputs an output signal based on one of a scan start signal and a carry signal of the previous stage. The first capacitor reduces a ripple component of the carry signal of the present stage which activates the next stage. Therefore, a carry signal having a reduced ripple component is supplied to the next stage, so that a transient current is intercepted at a transistor receiving the carry signal, which is arranged in the next stage, thus ensuring reliability of the shift register.

15 Claims, 8 Drawing Sheets

310 320 330 340 350

SHIFT REGISTER, SCAN DRIVING CIRCUIT AND DISPLAY DEVICE HAVING THE SAME

This application claims priority to Korean Patent Application No. 10-2006-0014545, filed on Feb. 15, 2006, and all the benefits accruing therefrom under 35 U.S.C. §119, the contents of which in its entirety are herein incorporated by reference.

BACKGROUND OF THE INVENTION

1. Field of the Invention

The present invention relates to a display device. More particularly, the present invention relates to a shift register, a scan driving circuit having the shift register, and a display device having the shift register.

2. Description of the Related Art

In general, extensive research and development for integrating a data driver integrated circuit ("IC") or a gate driver IC into a liquid crystal display panel has taken place in order to meet the requirements of lower prices and narrow bezels in display devices. In order to satisfy this integration, a scan driving circuit including an amorphous-silicon thin film transistor ("a-Si TFT") needs to be simplified.

BRIEF SUMMARY OF THE INVENTION

The present invention provides a shift register in a scan driving circuit which activates a plurality of gate lines of a display panel to reduce the occurrence of a ripple wave.

The present invention also provides a scan driving circuit and a display device having the above-mentioned shift register.

In one exemplary embodiment of the present invention, a shift register has a plurality of stages in which each of the stages generates an output signal in sequence. The shift register includes a present stage, a next stage following the present stage, the present stage outputting an output signal based on one of a scan start signal and a carry signal of the previous stage to the next stage, and a first capacitor. The first capacitor reduces a ripple component of the carry signal based on the present stage activating the next stage.

For example, the shift register may further include a first clock wiring which transfers a first clock signal to the present stage. The first capacitor is defined by a connecting wire electrically connecting to the present stage and the next stage, the first clock wire is overlaid with the connecting wire, and a gate insulation layer that is disposed between the connecting wire and the first clock wire, the connecting wire transfers the carry signal.

In exemplary embodiments, a low level of the first clock signal and a low level of an output signal outputted from the present stage are substantially equal to each other.

In exemplary embodiments, the connecting wire electrically connects to a first transistor which outputs the carry signal and a second transistor receiving the carry signal. The first transistor is arranged in the present stage, and the second transistor is arranged in the next stage. Hence, the shift register may further include a second capacitor electrically connected to a gate of the first transistor and a drain of the first transistor. For example, a ratio of a capacitance of the second capacitor to a capacitance of the first capacitor is set to about 1:1 to about 1:5. For another example, a ratio of a capacitance of the second capacitor to a capacitance of the first capacitor is set to about 1:1 to about 5:1.

In another exemplary embodiment of the present invention, a scan driving circuit includes a plurality of stages connected to each other. A first stage of the plurality of stages includes an input terminal into which a scan start signal is inputted, each of the stages receives at least one of a first clock signal and a second clock signal having a phase opposite to the first clock signal.

Each of the stages outputs an output signal to the gate lines based on one of a scan start signal and a carry signal of a previous stage. The stage includes a first capacitor reducing a ripple component of the carry signal outputted from the present stage to activate a next stage. The first capacitor is arranged between adjacent stages.

In still another exemplary embodiment of the present invention, a display device includes a cell array circuit and a scan driving circuit formed on a substrate. The cell array circuit includes a plurality of data lines and a plurality of gate lines. Each of the cell array circuits is connected to a corresponding pair of data lines and gate lines.

The scan driving circuit has a shift register including a plurality of stages connected to each other. The stages have a first stage with an input terminal into which a scan start signal is outputted, for sequentially selecting the gate lines based on an output signal of each stage. The stages receive at least one of a first clock signal and a second clock signal having a phase opposite to the first clock signal. Each of the stages outputs an output signal to the gate lines based on one of a scan start signal and a carry signal of a previous stage. The shift register includes a first capacitor which reduces a ripple component of the carry signal outputted from the present stage to activate the next stage. The first capacitor is arranged between adjacent stages.

According to the shift register, the scan driving circuit and the display device having the shift register, a carry signal having a reduced ripple component is supplied to the next stage, so that a transient current is intercepted at a transistor receiving the carry signal, which is arranged in the next stage, thus ensuring a reliability of the shift register.

BRIEF DESCRIPTION OF THE DRAWINGS

The above and other aspect, features and advantages of the present invention will become readily apparent by reference to the following detailed description when considered in conjunction with the accompanying drawings wherein.

DETAILED DESCRIPTION OF THE INVENTION

Figure 1:
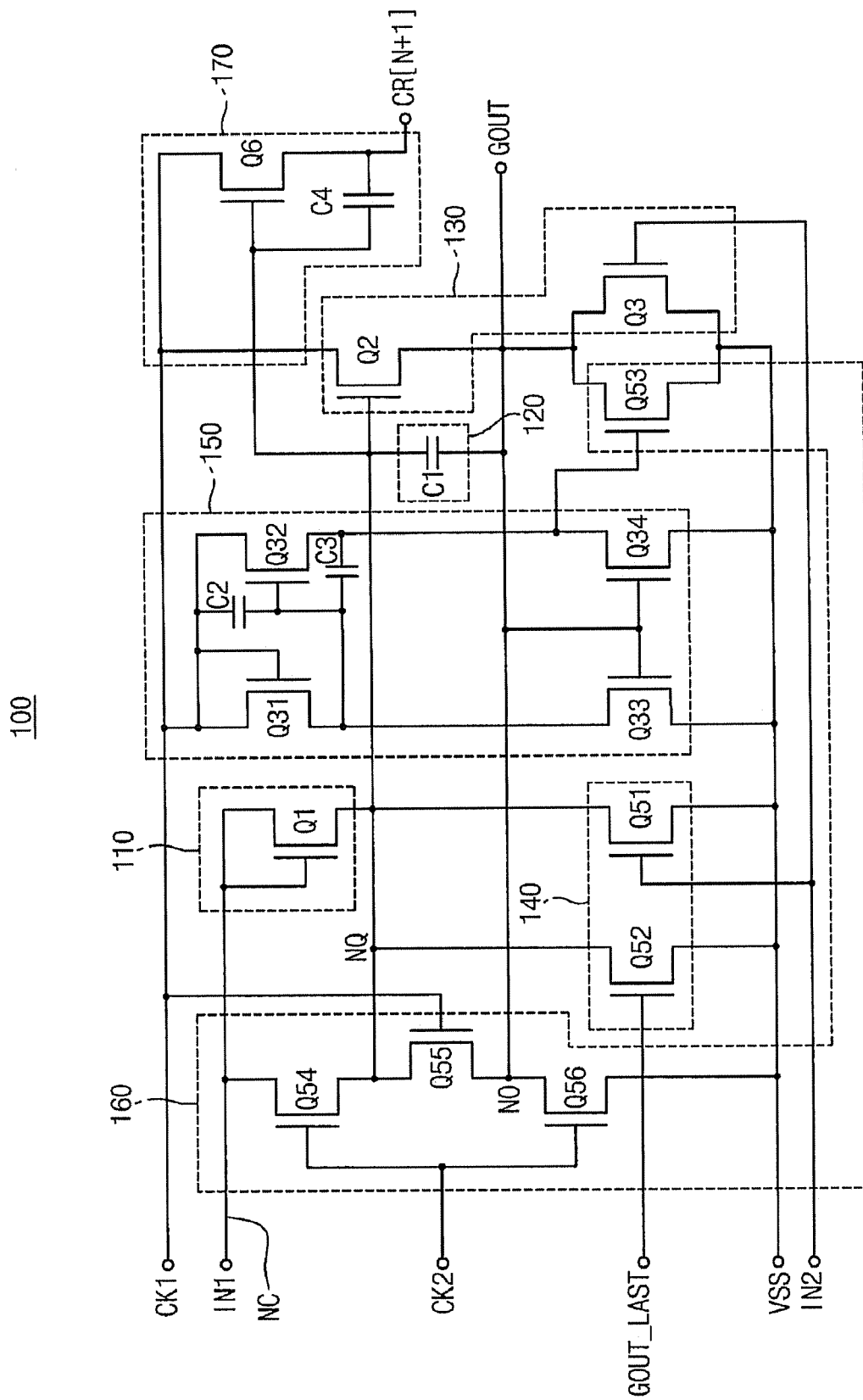
FIG. 1 is a circuit schematic diagram illustrating a unit stage of a shift register according to a comparative embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in more detail with reference to the accompanying drawings.

FIG. 1 is a circuit schematic diagram illustrating a unit stage of a shift register according to a comparative embodiment of the present invention.

Referring to FIG. 1, a unit stage 100 of a shift register according to a comparative embodiment of the present invention includes a buffer section 110, a charging section 120, a driving section 130, a discharging section 140, a first holding section 150, a second holding section 160 and a carry section 170. The unit stage 100 of a shift register outputs a scan signal (gate signal) in response to a scan start signal (STV) or a carry signal that is outputted from a previous stage.

The buffer section 110 includes a transistor Q1 having a drain (first current electrode), a gate (control electrode) and a source (second current electrode). The drain and the gate of the transistor Q1 are commonly connected to each other, and receive a first input signal IN1. The source of the transistor Q1 is electrically connected to the charging section 120. The buffer section 110 provides the charging section 120, the driving section 130, the discharging section 140 and the holding section 160 that are electrically connected to the source of the transistor Q1 with a carry signal that is provided from a previous stage. The carry signal is defined as a first input signal IN1. When the unit stage 100 is the first stage, the first input signal IN1 is a scan start signal STV.

The charging section 120 includes a capacitor C1. A first terminal of the capacitor C1 is electrically connected to the source of the transistor Q1 and the discharging section 140. A second terminal of the capacitor C1 is electrically connected to an output terminal GOUT of the driving section 130.

The driving section 130 includes a transistor Q2 and a transistor Q3. A drain of the transistor Q2 is electrically connected to a clock terminal CK1, and a gate of the transistor Q2 is electrically connected to the first terminal of the capacitor C1. A source of the transistor Q2 is electrically connected to the second terminal of the capacitor C1 and the output terminal GOUT. A drain of the transistor Q3 is electrically connected to the source of the transitory Q2 and a second terminal of the capacitor C1, and a source of the transistor Q3 is electrically connected to a first voltage VSS. When the unit stage 100 of the shift register is an even-numbered stage, a first clock signal CKV is inputted to the clock terminal CK that is electrically connected to the drain of the transistor Q2. Alternatively, when the unit stage of the shift register is odd-numbered stages, a second clock signal CKVB is inputted to the clock terminal CK1 that is electrically connected to the drain of the transistor Q2. The first and second clock signals CKV and CKVB may have opposite phases to each other. Alternatively, the first and second clock signals CKV and CKVB may have a phase difference such as 90 degrees and 270 degrees, etc. Therefore, the transistor Q2 performs a pull-up function, and the transistor Q3 performs a pull-down function.

The discharging section 140 includes a transistor Q51 and a transistor Q52. The discharging section 140 discharges a charge that is charged in the capacitor C1 into the first voltage terminal VSS through a source of the transistor Q51 in response to a second input signal IN2. The discharging section 140 discharges a charge that is charged in the capacitor C1 into the first voltage terminal VSS through a source of the transistor Q51 in response to a last scan signal GOUT_LAST.

Particularly, the transistor Q51 includes a drain electrically connected to the first terminal of the capacitor C1, a gate electrically connected to a second input signal IN2, and a source electrically connected to the first voltage terminal VSS. The transistor Q52 includes a drain electrically connected to the first terminal of the capacitor C1, a gate electrically connected to a last scan signal GOUT_LAST, and a source electrically connected to the first voltage terminal VSS. The second input signal IN2 is a gate on signal VON of a next stage such as a reset signal.

The first holding section 150 includes a plurality of transistors Q31, Q32, Q33, Q34 and a plurality of capacitors C2 and C3, and controls an on/off operation of the second holding section 160.

Particularly, the transistor Q31 includes a drain and a gate that are electrically connected to each other, and electrically connected to the first clock terminal CK1. The transistor Q32 includes a drain that is electrically connected to the first clock terminal CK1, a gate that is electrically connected to a source of the transistor Q31, and a source that is electrically connected to the second holding section 160 (e.g., via a transistor Q53). The capacitor C2 includes a first terminal that is electrically connected to a drain of the transistor Q32 and a second terminal that is electrically connected to a gate of the transistor Q32. The capacitor C3 includes a first terminal that is electrically connected to a gate of the transistor Q32 and a second terminal that is electrically connected to a source of the transistor Q32. The transistor Q33 includes a drain that is electrically connected to the source of the transistor Q31 and a gate of the transistor Q32, a gate that is electrically connected to the output terminal GOUT, and a source that is electrically connected to the first voltage terminal VSS. The transistor Q34 includes a drain that is electrically connected to a source of the transistor Q32 and the second holding section 160, a gate that is electrically connected to the output terminal GOUT, and a source that is electrically connected to the first voltage terminal VSS.

The second holding section 160 includes a plurality of transistors Q53, Q54, Q55 and Q56, and prevents the output at output terminal GOUT from floating. When the output terminal GOUT is at a high level, the second holding section 160 maintains an off-status so that the second holding section 160 performs a holding operation.

Particularly, the transistor Q53 includes a drain electrically connected to the output terminal GOUT, a gate electrically connected to the first holding section 150, and a source electrically connected to the first power voltage VSS. The transistor Q54 includes a drain electrically connected to the first input signal IN1, a gate electrically connected to the second clock terminal CK2 and a source electrically connected to the first terminal of the capacitor C1. The transistor Q55 includes a drain electrically connected to a source of the transistor Q54 and the first terminal of the capacitor C1, a gate electrically connected to the first clock terminal CK1, and a source electrically connected to the output terminal GOUT. The transistor Q56 includes a drain electrically connected to the output terminal GOUT, a gate electrically connected to the second clock terminal CK2 and the gate of the transistor Q54, and a source electrically connected to the first power voltage VSS. The first and second clock signals CKV and CKVB have opposite phases to each other. Alternatively, the first and second clock signals CKV and CKVB may have a phase difference such as 90 degrees and 270 degrees, etc.

Therefore, when the output terminal GOUT is at a high level, each of the transistors Q32 and Q34 performs a pull-down function that pull downs a gate level of the transistor Q53 to the first power voltage VSS.

When the output signal that is outputted from the output terminal GOUT is at a low level, a control voltage synchronizing with the first clock signal CKV is transferred to a gate of the transistor Q53 through the transistor Q32. The gate voltage of the transistor Q32 is smaller than a threshold voltage of the transistor Q31 at a high level voltage of the first clock signal CKV except when the output terminal GOUT is at a high level.

Therefore, the transistor Q32 may be a transferable control voltage synchronized with the first clock signal CKV to a gate of the transistor Q53 except when the output terminal GOUT is at a high level.

When the second clock signal CKVB is at a high level, the output terminal GOUT of the register is at a low level, so that the transistor Q56 performs a hold operation that holds the output terminal GOUT to the first voltage source VSS.

The carry section 170 includes a transistor Q6 and a capacitor C4 that is electrically connected to a gate-source of the transistor Q6, and receives the first clock signal CKV through the first clock terminal CK1 that is electrically insulated from the output terminal GOUT. The carry section 170 provides a carry node NC of a next stage with the clock signal CKV in response to turn-on of the Q-node NQ.

Although a voltage level of the output terminal GOUT is variable, the carry section 170 outputs the first clock signal CKV as the carry signal. For example, although a gate signal provided to the gate line is destroyed by shortening a wire transferring the signals, the carry signal is regularly outputted.

A plurality of transistors of the shift register as shown in FIG. 1 are electrically connected to each other through bridge sections such as an indium zinc oxide ("IZO") bridge section or an indium tin oxide ("ITO") bridge section, etc.

In a reliability test of high temperature and high humidity, for example, about 60 degrees Centigrade and about 95% humidity, erosion occurs in the IZO bridge section. The erosion provokes an opening of the IZO bridge section.

Therefore, a pixel error is generated in the liquid crystal display panel. In a reliability test of high temperature and high humidity, moisture is infiltrated in a contact portion, for example the IZO bridge section that is formed adjacent to a sealant securing an array substrate and a color filter substrate, so that erosion is generated. The erosion enhances an impedance of the IZO bridge section.

In a condition of increasing the impedance of the IZO bridge section, heat is generated as a result of a current flowing through the contact portion of the transistor Q1. The heat may destroy the IZO bridge contact portion of the transistor Q1.

The current flowing through the contact portion of the transistor Q1 may be affected by a ripple component that is generated from the contact portion of the transistor Q1. The ripple component is generated by the first clock signal CKV and the second clock signal CKVB. In addition, when the first voltage VSS and an off level Voff of the first clock signal CKV are differentially set, or the second voltage VSS and an off level Voff of the second clock signal CKVB are differentially set, the ripple component increases. The ripple component is increases more due to a decrease of a threshold voltage Vth of the transistor Q1 and an increase of an on current Ion of the transistor Q1. The increasing of the ripple component is a cause of increased current flowing through the transistor Q1.

Figure 2A:
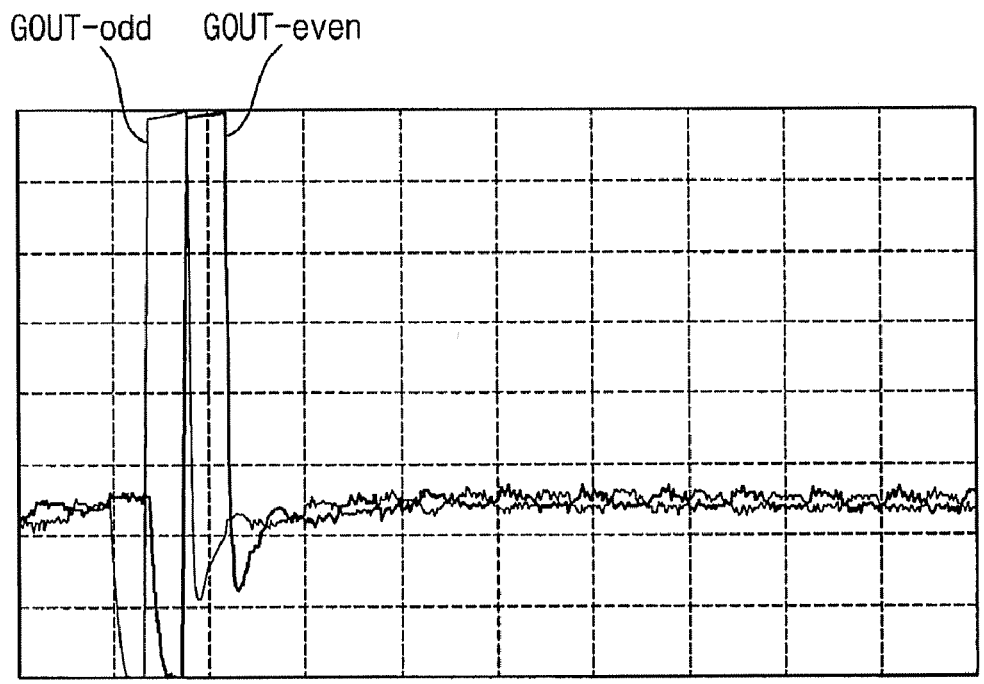
FIGS. 2A and 2B are waveform diagrams illustrating a gate signal that is outputted from the shift register shown in FIG. 1, when the shift register is driven in a relatively high temperature and a relatively low temperature, respectively.
Figure 2B:
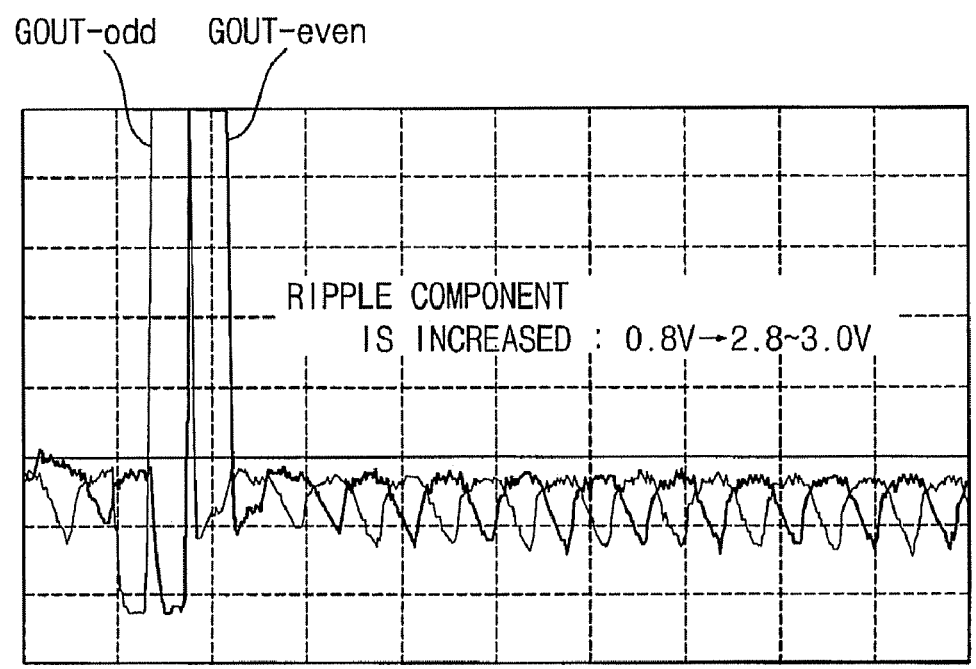

FIGS. 2A and 2B are waveform diagrams illustrating a gate signal that is outputted from the shift register shown in FIG. 1, when the shift register is driven in a relatively high temperature and a relatively low temperature, respectively. In particular, a gate signal GOUT-odd outputted from an even-numbered stage of the shift register and a gate signal GOUT-even outputted from an odd-numbered stage of the shift register are illustrated in FIGS. 2A and 2B.

Referring to FIG. 2A, when the shift register is operated in a room temperature condition, for example about 25 degrees Centigrade, which has the first voltage VSS of about −6 V and the off level Voff of the first clock signal CKV of about −12 V, the ripple component that is included in a gate signal outputted from the shift register is relatively low.

In the meantime, referring to FIG. 2B, when the shift register is operated in a high temperature condition, for example about 50 degrees Centigrade, which has the first voltage VSS of about −6 V and the off level Voff of the first clock signal CKV of about −12 V, the ripple component that is included in a gate signal outputted from the shift register is relatively high. For example, about −0.8 V ripple component has been generated in FIG. 2A, but about 2.8 V to about 3.0 V ripple component has been generated in FIG. 2B.

More generalized waveforms for the waveforms of the gate signals are explained with reference to FIGS. 3A and 3B.

Figure 3A:
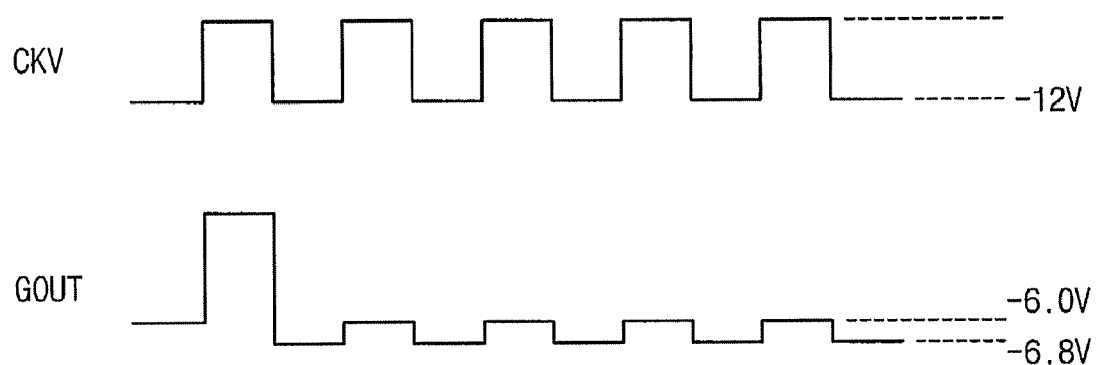
FIGS. 3A and 3B are waveform diagrams illustrating gate signals corresponding to the first clock signal (CKV), when the shift register shown in FIG. 1 is driven in a relatively high temperature and a relatively low temperature, respectively.
Figure 3B:
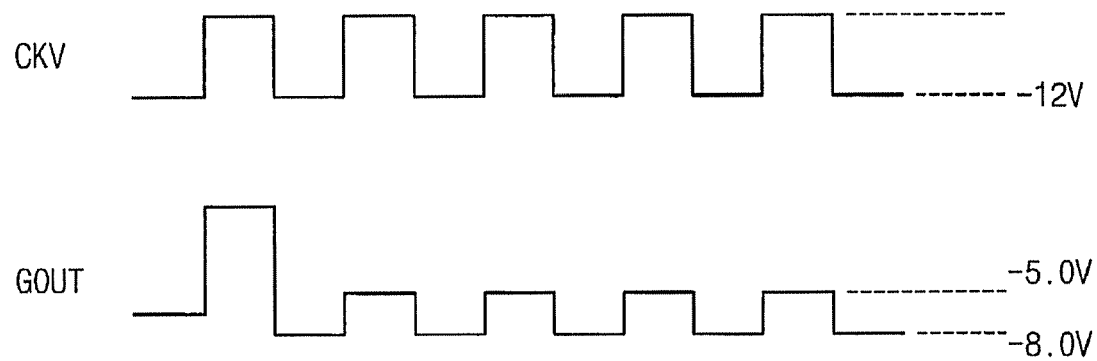

FIGS. 3A and 3B are waveform diagrams illustrating gate signals corresponding to the first clock signal CKV, when the shift register shown in FIG. 1 is driven in a relatively high temperature and a relatively low temperature, respectively.

Referring to FIG. 3A, when the shift register is operated in a room temperature condition, for example about 25 degrees Centigrade, which has the first voltage VSS of about −6 V and the off level Voff of the first clock signal CKV of about −12 V, a gate signal that is outputted corresponds to the first clock signal CKV that has a ripple component of about −6.0 V and about −6.8 V. For example, a ripple component of about 0.8 V may be included in the gate signal.

Referring to FIG. 3B, when the shift register is operated in a high temperature, for example about 50 degrees Centigrade, and which has the first voltage VSS of about −6 V and the off level Voff of the first clock signal CKV of about −12 V, a gate signal that is outputted corresponds to the first clock signal CKV has a ripple component of about −5.0 V and about −8.0 V. For example, a ripple component of about 3.0 V may be included in the gate signal.

As the temperature increases, it is observed that a ripple component increases from about 0.8 V to about 2.8 V~3.0 V.

The ripple component increases a current that is supplied to a contact portion of the transistor Q1 receiving a carry signal, which is arranged in the next stage. As the current increases, a joule heat is generated, so that the IZO bridge section of the transistor Q1 is destroyed by the joule heat. A carry signal is not supplied to the next stage because the IZO bridge section is destroyed, so that an operating error is generated from the next stage.

However, in the exemplary embodiment, a current that flows through the transistor Q1 receiving a carry signal is controlled, so that a reliability of the shift register is guaranteed. Especially, heat being generated in the contact portion of the transistor Q1, that is, the IZO bridge section, is prevented so that the reliability of the shift register is guaranteed.

Figure 4:
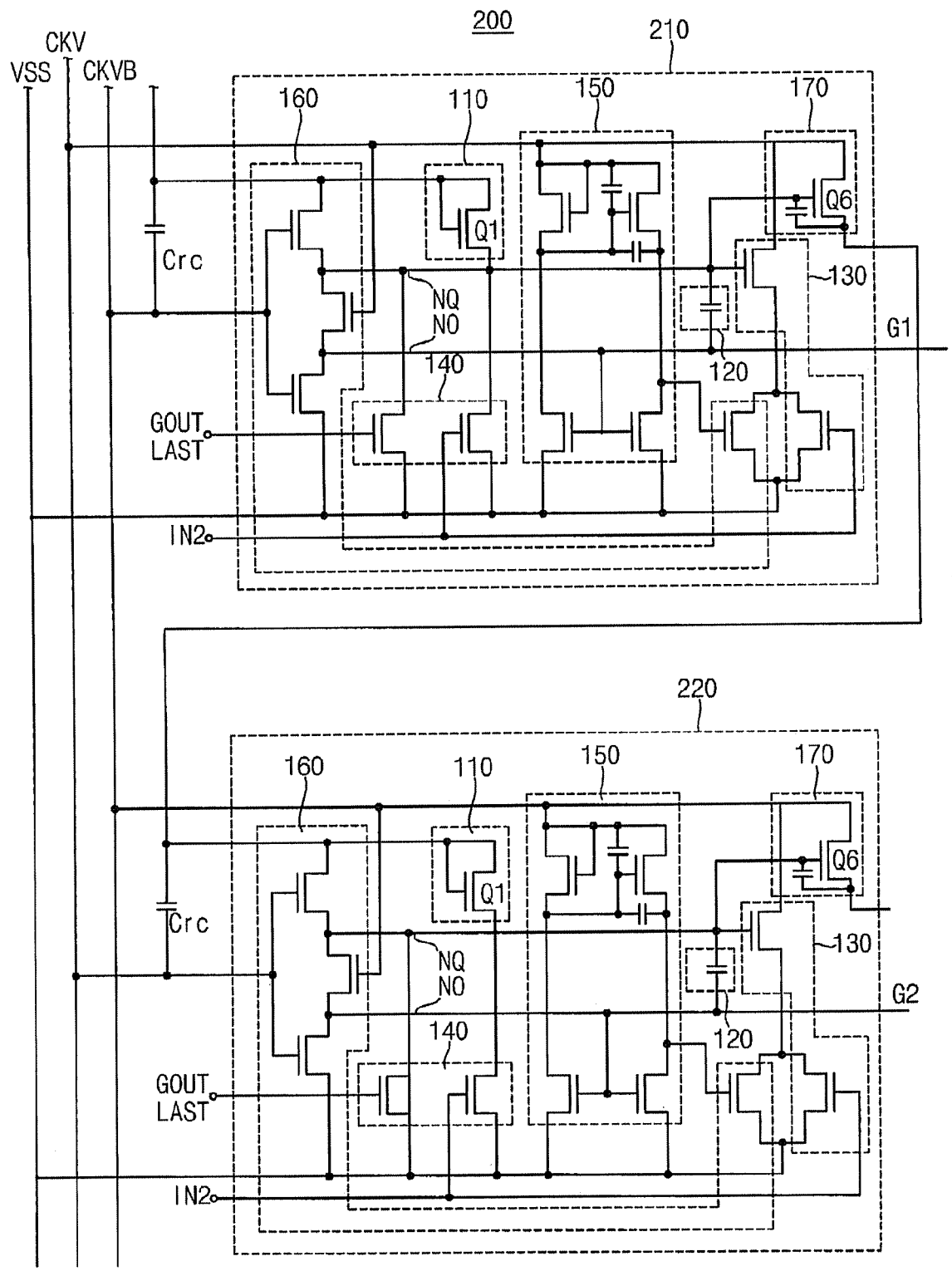
FIG. 4 is a circuit schematic diagram illustrating a shift register according to an exemplary embodiment of the present invention.
Figure 5:
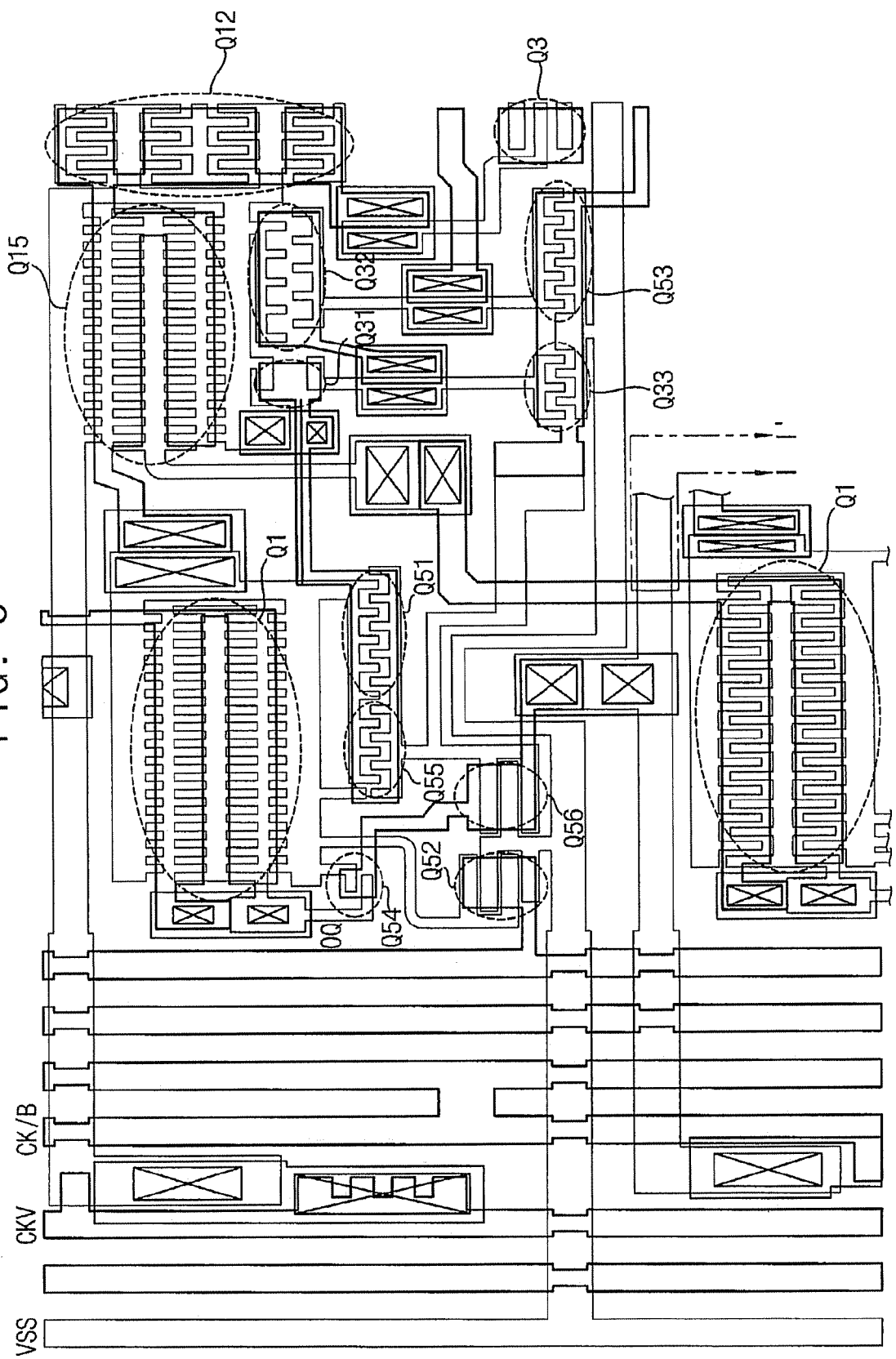
FIG. 5 is a plan view layout diagram illustrating the shift register shown in FIG. 4.
Figure 6:
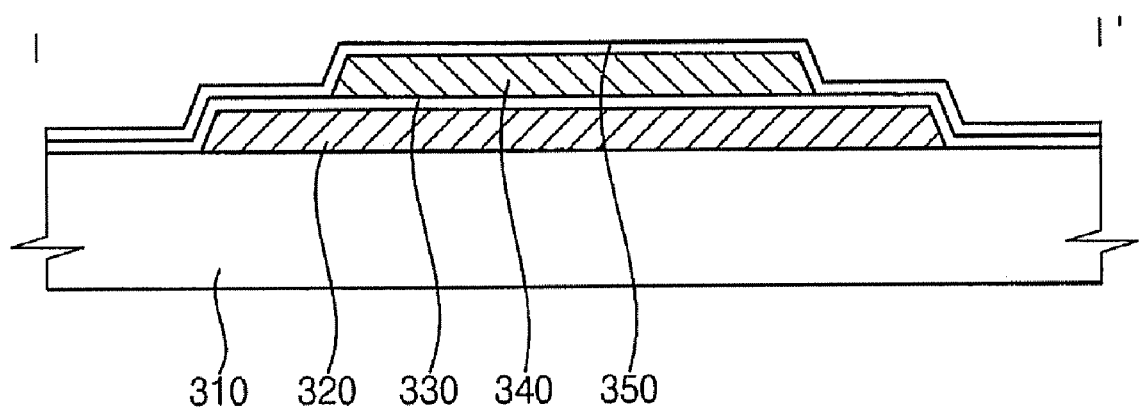
FIG. 6 is a cross-sectional view taken along line I-I' in FIG. 5.

FIG. 4 is a circuit schematic diagram illustrating a shift register according to an exemplary embodiment of the present invention. FIG. 5 is a plan view layout diagram illustrating a shift register shown in FIG. 4. FIG. 6 is a cross-sectional view taken along a line I-I' in FIG. 5.

Referring to FIGS. 4 and 5, a shift register 200 according to an exemplary embodiment of the present invention includes a present stage 210 that is followed by a next stage 220 and a ripple reducing capacitor Crc that is arranged between the present stage 210 and the next stage 220. For convenience of description, a present stage of the shift register and a next stage following the present stage are described in FIG. 4. Referring now in specific detail to FIG. 4 in which like reference numerals identify identical elements as they relate to the present stage 210 which is configured similarly to the next stage 220 in FIG. 4, detailed descriptions about the identical elements will be omitted. For convenience of description, a portion of the present stage 210 of the shift register 200 and a portion of the next stage 220 of the shift register 200 are described with reference to FIG. 4.

A wire electrically connecting a source of the transistor Q6 that is arranged in the present stage 210 and a gate-drain common terminal of the transistor Q1 that is arranged in the next stage 220, defines a first electrode of the ripple reducing capacitor Crc. A wire that is arranged in the next stage 220 to transfer the first clock signal CKV to the next stage 220, defines a second electrode of the ripple reducing capacitor Crc.

As shown in FIG. 6, the ripple reducing capacitor Crc is defined by a gate pattern 320 formed on the insulating substrate 310, a gate insulation layer 330 formed on the gate pattern 320 and a source-drain pattern 340 formed on the gate insulation layer 330. A passivation layer 350 is formed on the source-drain pattern 340. The gate insulation layer 330 has a predetermined dielectric constant (∈), so that the gate insulation layer 330 performs a dielectric substance layer operation of the ripple reducing capacitor Crc.

The gate pattern 320 is formed in order to define a gate electrode of the transistor Q1 that is arranged in the next stage 220. The gate pattern 320 extending into the present stage 210 is electrically connected to a source of the transistor Q6 of the present stage 210 via a contact hole (not shown).

The source-drain pattern 340 is formed in order to transfer the first clock signal CKV to the next stage 220.

A capacitance of the ripple reducing capacitor Crc is proportional to an overlaid area size between the gate pattern 320 and the source-drain pattern 340.

In operation of the shift register referring again to FIG. 4, a ripple component is included in a carry signal that is outputted from the transistor Q6 arranged in the present stage 210, and provided to the transistor Q1 arranged in the next stage 220. For example, the ripple component that is included in the carry signal outputted from the transistor Q1 is generated to be synchronized with the first clock signal CKV.

However, the ripple reducing capacitor Crc is defined by coupling between a wire transferring the carry signal and a wire transferring a second clock signal CKVB before the carry signal is supplied to the transistor Q1 that is arranged in the next stage, so that the ripple component by the first clock signal CKV is reduced. The second clock signal CKVB may have an opposite phase to the first clock signal CKV.

An amount of reduction of the ripple component is defined by a ratio of a capacitance of the fourth capacitor C4 and a capacitance of the ripple reducing capacitor Crc. The fourth capacitor C4 is electrically connected to a gate of the transistor Q6 and a source of the transistor Q6.

For example, a ratio of a capacitance of the fourth capacitor C4 and a capacitance of the ripple reducing capacitor Crc is about 1:1 to about 1:5.

For another example, a ratio of a capacitance of the fourth capacitor C4 and a capacitance of the ripple reducing capacitor Crc is about 1:1 to about 5:1.

In this exemplary embodiment as shown in FIGS. 4 and 5, a ripple reducing capacitor Crc of a double layer structure is defined by a wire electrically connected between the present stage and the next stage, and a wire transferring the first clock signal CKV. Alternatively, a ripple reducing capacitor Crc of a triple layer structure may be defined.

Figure 7:
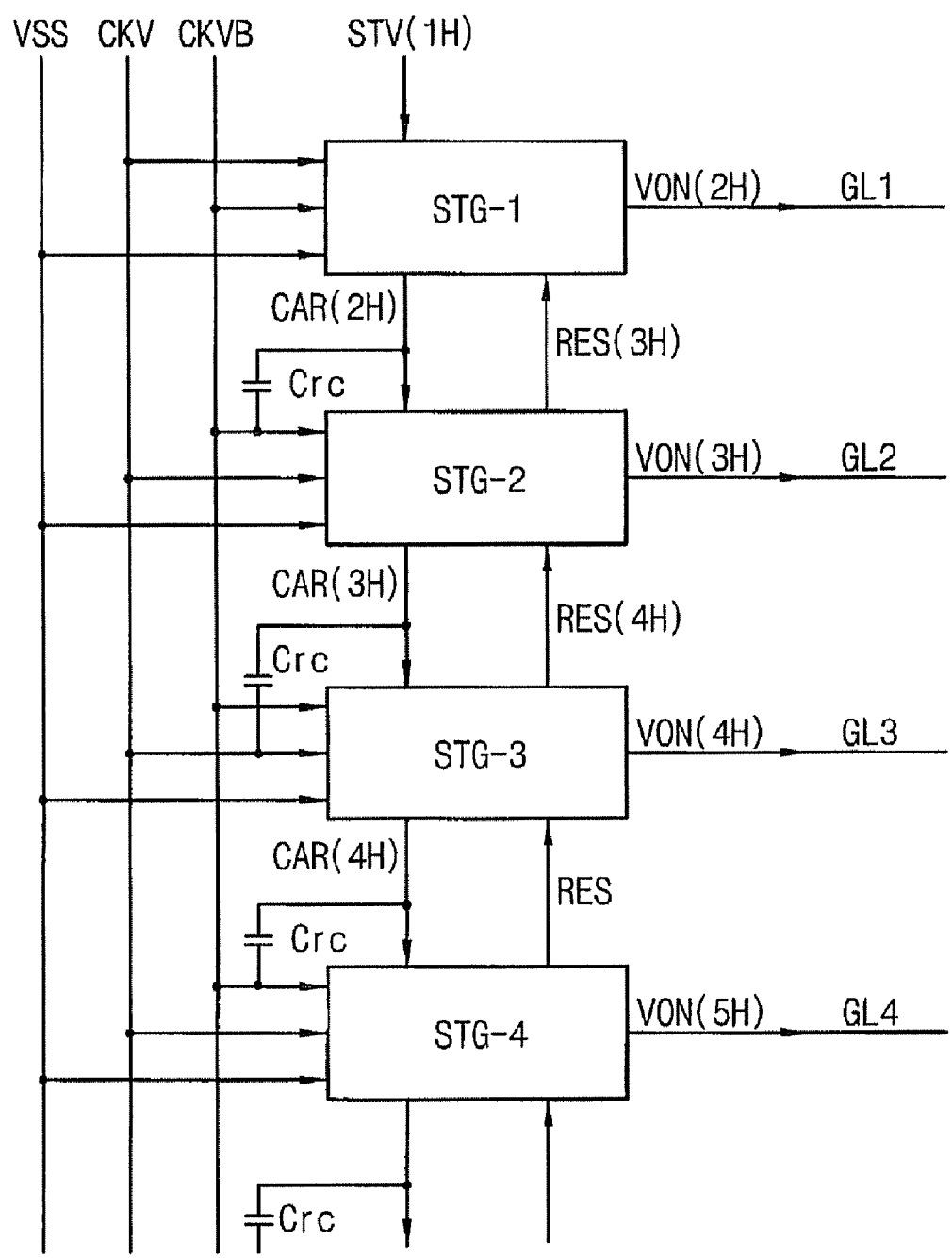
FIG. 7 is a block diagram illustrating an operation of the shift register shown in FIG. 4.

Then, when the first voltage VSS and the first and second clock signals CKV and CKVB are supplied into all stages, a driving trace by time interval is explained using FIG. 7.

FIG. 7 is a block diagram illustrating an operation of the shift register 200 shown in FIG. 4. In FIG. 7, a wire transferring a carry signal that is outputted from the odd-numbered stages STG-1 and STG-3 to the following even-numbered stages STG-2 and STG-4, is electrically connected to the ripple reducing capacitor Crc that is electrically connected to the second clock signal CKVB.

A wire transferring a carry signal that is outputted from the even-numbered stages STG-2 and STG-4 following the odd-numbered stages STG-1 and STG-3, is electrically connected to the ripple reducing capacitor Crc that is electrically connected to the first clock signal CKV.

Referring to FIGS. 4 and 7, as a scan start signal STV is supplied to the first stage STG-1 during a 1 H time interval (or a time interval that activates the first gate line GL1), a Q-node NQ of the first stage STG-1 is charged. The 1 H time interval is defined by following Equation 1.

$$1H = \left(\frac{1}{f}\right) * \left(\frac{1}{\text{a number of gate lines}}\right) \quad \text{Equation 1}$$

For example, when a driving frequency f and a resolution are 60 Hz and XGA(1024*768), respectively, a time of 1 H is calculated by 1/60* 1/768=21.7 μs.

Then, a gate on signal VON and a second carry signal CAR are simultaneously outputted to the first gate line GL1 in a 2 H time interval, and a Q-node NQ of the second stage STG-2 is charged. The second carry signal CAR is supplied to the second stage STG-2 through the ripple deducing capacitor Crc receiving the second clock signal CKVB, so that the ripple component included in the second carry signal CAR is reduced and supplied to the second stage STG-2.

Then, a gate on signal VON, a third carry signal CAR and a reset signal RES are simultaneously outputted to the second gate line GL2 in a 3 H time interval, and a Q-node NQ of the third stage STG-3 is charged, and a Q-node NQ of the first stage STG-1 and the first gate line GL1 are simultaneously reset. The third carry signal CAR is supplied to the third stage STG-3 through the ripple deducing capacitor Crc receiving the first clock signal CKV, so that the ripple component included in the third carry signal CAR is reduced and supplied to the third stage STG-3.

Then, a gate on signal VON, a fourth carry signal CAR and a reset signal RES are simultaneously outputted to the third gate line GL3 in a 4 H time interval, a Q-node NQ of the fourth stage STG-4 is charged, and a Q-node NQ of the second stage STG-2 and the second gate line GL2 are simultaneously reset. The fourth carry signal CAR is supplied to the fourth stage STG-4 through the ripple deducing capacitor Crc receiving the second clock signal CKVB, so that the ripple component included in the fourth carry signal CAR is reduced and supplied to the fourth stage STG-4.

Figure 8:
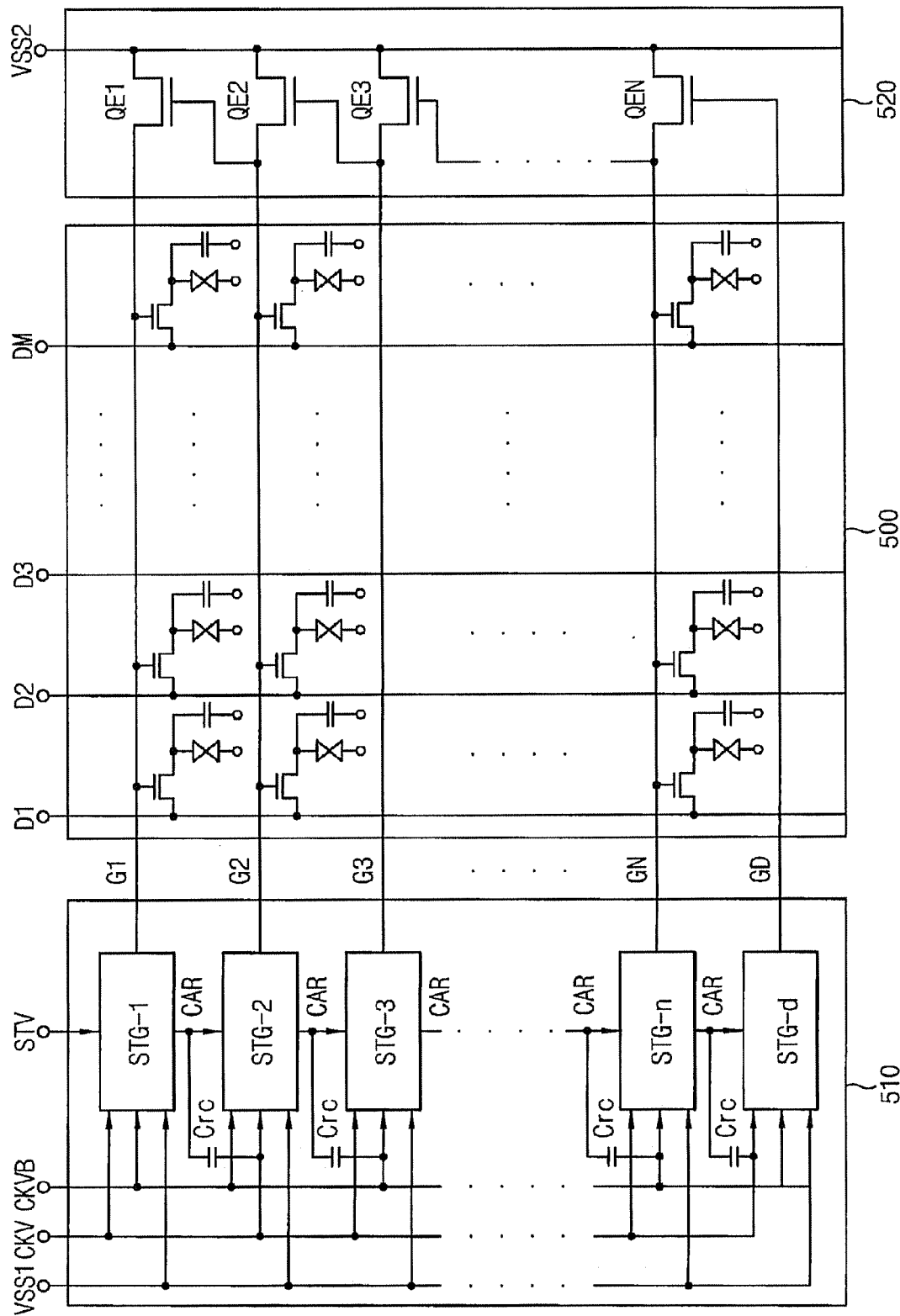
FIG. 8 is a block diagram illustrating a liquid crystal panel having a scan driving circuit according to another exemplary embodiment.

FIG. 8 is a block diagram illustrating a liquid crystal panel having a scan driving circuit according to another exemplary embodiment.

Referring to FIG. 8, a first scan driving circuit 510 having a shift register is arranged in a first area of a cell array circuit 500, and a second scan driving circuit 520 is arranged in a second area of the cell array circuit 500. The cell array circuit 500 is defined by a plurality of data lines and a plurality of gate lines. The first and second scan driving circuits 510 and 520 are formed on the same substrate that is the cell array circuit 500 is formed on. The first and second scan driving circuits 510 and 520 are formed through the same process for forming a thin film transistor of the cell array circuit 500.

The first scan driving circuit 510 includes a plurality of stages receiving a first clock signal CKV and a second clock signal CKVB. The stages are electrically connected to each other. A scan start signal STV is inputted to an input terminal of the first stage. Each of the stages is electrically connected to first terminals of gate lines of the cell array circuit 500 and outputs a plurality of output signals G1, G2, . . . , GN and GD.

The second scan driving circuit 520 includes a plurality of transistors QE1, QE2, . . . , QEN that is electrically connected to a second terminal of the gate lines of the cell array circuit 500 and define a discharging path of the scan signal that is transferred through the gate lines.

For example, the transistor QE1 includes a source that is electrically connected to an end portion of the first gate line, a drain that is electrically connected to a third voltage VSS2 and a gate that is electrically connected to an end portion of the second or next gate line.

In operation, a first scan signal G1 transferred through a first gate line is discharged to a third voltage VSS2 based on a scan signal G2 transferred through the second gate line G2. For example, the third voltage VSS2 is smaller than or equal to the first voltage VSS1. For another example, the third voltage VSS2 is greater than the first voltage VSS1.

A plurality of transistors for defining an additional discharging path is formed at end portions of each of the gate lines, so that a negative influence may be eliminated for the next stage because of a delay of scan signal transferring through the gate line.

Moreover, a capacitance of the transistor Q3 (see FIG. 1) that performs a pull-down function that is disposed in the driving section 130 may be compensated. To compensate the transistor Q3, sizes of the transistors QE1, QE2, . . . , QEN are about 5 times larger than the transistor Q3.

According to the various exemplary embodiments of the present invention as described above, an internal node and an output node of a scan driving circuit that is disposed in an LCD device it is prevented from being floated using a first clock signal CKV or a second clock signal CKVB.

Therefore, a deterioration of the transistor by a high voltage is prevented, so that a reliability of the transistor is enhanced. Moreover, a reliability of a liquid crystal display panel having a scan driving circuit mounted thereon, which has an amorphous silicon thin-film transistor ("a-Si TFT"), is enhanced. Additionally, a reliability of an LCD device having the liquid crystal display panel is enhanced.

According to the present invention, the ripple reducing capacitor that is arranged between the present stage and the next stage is defined in a shift register having a plurality of stages electrically connected to each other and sequentially outputting gate signals. The ripple reducing capacitor removes a ripple component of the carry signal of the present stage and that activates a next stage.

Therefore, a carry signal having a reduced ripple component is supplied to the next stage, so that a transient current is intercepted at a transistor receiving the carry signal arranged in the next stage. Therefore, a reliability of the shift register is guaranteed.

Furthermore, an overcurrent that flows through the transistor receiving the carry signal is blocked, so that generation of heat is prevented in the contact portion of the transistor, for example, the IZO bridge section. Consequently, destruction of the contact portion by heat is prevented so that the reliability of the shift register is guaranteed.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A shift register having a plurality of stages in which each of the stages generate an output signal in sequence, the shift register comprising:
   a present stage;
   a next stage following the present stage, the present stage outputting an output signal based on one of a scan start signal and a carry signal of a previous stage to the next stage;
   a first capacitor arranged between the present stage and the next stage; and
   a first clock wire which transfers a first clock signal to the present stage,
   wherein the first capacitor is defined by a connecting wire electrically connecting to the present stage and the next stage, the first clock wire being overlaid with the connecting wire, and a gate insulation layer being disposed between the connecting wire and the first clock wire, the connecting wire transferring the carry signal.

2. The shift register of claim 1, wherein a low level of the first clock signal and a low level of an output signal that is outputted from the present stage are substantially equal to each other.

3. The shift register of claim 1, wherein the connecting wire electrically connects to a first transistor outputting the carry signal and a second transistor receiving the carry signal, the first transistor being arranged in the present stage, and the second transistor being arranged in the next stage.

4. The shift register of claim 3, further comprising a second capacitor electrically connected to a gate of the first transistor and a drain of the first transistor,
   wherein a ratio of a capacitance of the second capacitor to a capacitance of the first capacitor is set to about 1:1 to about 1:5.

5. The shift register of claim 3, further comprising a second capacitor electrically connected to a gate of the first transistor and a drain of the first transistor,
   wherein a ratio of a capacitance of the second capacitor to a capacitance of the first capacitor is set to about 1:1 to about 5:1.

6. The shift register of claim 3, further comprising a second capacitor electrically connected to a gate of the first transistor and a drain of the first transistor,
   wherein a capacitance of the first capacitor is substantially equal to a capacitance of the second capacitor.

7. The shift register of claim 1, wherein the first capacitor reduces a ripple component of the carry signal outputted from the present stage to activate the next stage.

8. A scan driving circuit comprising a plurality of stages connected to each other, a first stage of the plurality of stages includes an input terminal into which a scan start signal is inputted, each of the stages receives at least one of a first clock signal and a second clock signal having a phase different from a phase of the first clock signal, and
   each of the stages outputting an output signal to the gate lines based on one of the scan start signal and a carry signal of a previous stage,
   wherein the stages comprise a first capacitor arranged between adjacent stages, and
   the first capacitor is defined by a connecting wire electrically connected to the present stage and the next stage and transferring the carry signal, a first clock wire being overlaid by the connecting wire, and a gate insulation layer being disposed between the connecting wire and the first clock wire.

9. The scan driving circuit of claim 8, wherein the connecting wire electrically connects to a first transistor and a second transistor, the first transistor being arranged in the present stage, which outputs the carry signal, and the second transistor being arranged in the next stage, receiving the carry signal.

10. The scan driving circuit of claim 9, further comprising a second capacitor connected to a gate of the first transistor and a drain of the first transistor,
    wherein a capacitance of the first capacitor is substantially equal to a capacitance of the second capacitor.

11. The scan driving circuit of claim 8, wherein a low level of the first clock signal is substantially equal to a low level of the output signal of the present stage.

12. The scan driving circuit of claim 8, wherein a phase of the first clock signal and that of the second clock signal are substantially opposite to each other.

13. The scan driving circuit of claim 8, wherein the first capacitor reduces a ripple component of the carry signal outputted from a present stage to activate a next stage.

14. A display device comprising:
    a cell array circuit formed on a substrate, the cell array circuit having a plurality of data lines and a plurality of gate lines, and each of the cell array circuits being connected to a corresponding pair of data lines and gate lines; and
    a scan driving circuit formed on the substrate, the scan driving circuit having a shift register including a plurality of stages connected to each other, the stages having a first stage with an input terminal into which a scan start signal is inputted, for sequentially selecting the gate lines based on an output signal of each stage, and the stages receiving at least one of a first clock signal and a second clock signal having a phase different from a phase of the first clock signal, and each of the stages outputting an output signal to the gate lines based on one of the scan start signal and a carry signal of a previous stage, wherein the shift register comprises a first capacitor arranged between adjacent stages; and the first capacitor is defined by a connecting wire electrically connected to the present stage and the next stage and transferring the carry signal, a first clock wire being overlaid by the connecting wire, and a gate insulation layer being disposed between the connecting wire and the first clock wire.

15. The display device of claim 14, wherein the first capacitor reduces a ripple component of the carry signal outputted from a present stage to activate a next stage.

* * * * *